United States Patent [19]
Boudewijns et al.

[11] Patent Number: 4,868,855
[45] Date of Patent: Sep. 19, 1989

[54] CHARGE-COUPLED SEMICONDUCTOR DEVICE AND IMAGE SENSOR DEVICE OF HIGH INFORMATION DENSITY

[75] Inventors: Arnoldus J. J. Boudewijns; Marnix G. Collet, both of Eindhoven, Netherlands

[73] Assignee: U.S. Philips Corp., New York, N.Y.

[21] Appl. No.: 615,843

[22] Filed: May 31, 1984

[30] Foreign Application Priority Data

Jun. 3, 1983 [NL] Netherlands ............................ 8301977

[51] Int. Cl.$^4$ ...................... G11C 19/28; H01L 29/78; H01L 27/14; H01L 31/00
[52] U.S. Cl. ........................................ 377/60; 357/24; 357/30
[58] Field of Search .................. 357/24, 30; 377/57-63

[56] References Cited

U.S. PATENT DOCUMENTS

| | | | |
|---|---|---|---|
| 3,909,803 | 9/1975 | Bankowski et al. | 357/24 LR |
| 3,931,463 | 1/1976 | Levine | 357/24 LR |
| 3,932,775 | 1/1976 | Kosonocky | 357/24 LR |
| 4,178,614 | 12/1979 | Sauer | 357/30 |

FOREIGN PATENT DOCUMENTS 0106286 4/1984 European Pat. Off. .

OTHER PUBLICATIONS

Sequin, "Interlacing in Charge-Coupled Imaging Devices", IEEE Trans. Electron Devices, vol. ED-20 (6/73), pp. 535-541.

*Primary Examiner*—Gene M. Munson
*Attorney, Agent, or Firm*—William L. Botjer

[57] ABSTRACT

In a CCD, especially in an image sensing device, the electrodes of the sensor part and the memory part can be switched between a reference level signal and clock pulse signals. As a result, the information density and hence in the image sensor device the number of image lines to be read out independently can be doubled. Thus, the resolution is improved and it is possible to record even and odd lines simultaneously (for example, for an electronic still camera).

10 Claims, 5 Drawing Sheets

CHARGE-COUPLED SEMICONDUCTOR DEVICE AND IMAGE SENSOR DEVICE OF HIGH INFORMATION DENSITY

BACKGROUND OF THE INVENTION

The invention relates to a charge coupled semiconductor device. The device comprises a semiconductor body in which at least one charge transfer channel is defined at a major surface of the body. A system of electrodes is provided on the major surface. A reference signal can be applied to the electrodes to store charge in the channel. A clock signal can be applied to the electrodes to transport charge in the channel.

This application is related to applications entitled "Charge-coupled semiconductor device with dynamic control" Ser. No. 616,936, filed June 7, 1984) and "Charged Coupled Device Ser. No. 615,842, filed May 31, 1984) which are assigned to the same assignee as this application and which are incorporated by reference herein.

The devices, also known as CCD's (Charge-Coupled Devices), are used in various applications. For example, the devices are used as delay lines or memory elements. They are especially useful in image sensor devices.

The invention therefore relates more particularly to a charge coupled image sensor device in high a number of charge transfer channels are arranged. The channels are separated from each other and transport charge from a radiation-sensitive part to a memory part of the device.

Such image sensor devices are used in solid state cameras. In the cameras, the information stored in the memory part can be converted into a television signal, or may be temporarily stored, for example on a memory disk or memory tape.

Such an image sensor device is described in U.S. Pat. No. 3,909,803. The device is a charge coupled image sensor with four-phase transport. The various image elements are defined by groups of four electrodes. Charge is collected alternately under each of the four electrodes.

For this purpose, in a first exposure period charge is collected under a first set of electrodes. The collected charge is transferred to the memory part by applying suitable clock voltages to the electrodes. Subsequently, in a second exposure period charge is collected under a second set of electrodes located next to the first set. The collected charge is then also transferred to the memory part. Subsequently, the process is repeated with third and fourth sets of electrodes. Due to the fact that charges are collected separately under each set of electrodes, the resolution of the image sensor device is increased. However, this increased resolution is partly eliminated because charge carriers generated under the other electrodes are collected under the relevant electrode.

Moreover, the increased resolution is at the expense of a considerably increased sensing time. After charge has been collected under the first set of electrodes, this charge must first be drained to the memory part before charge can be collected under the next set. In this embodiment, the sensing time is therefore approximately quadrupled. Moreover, the four integration periods are separated in time so that in the memory part there is stored an image which is composed of scenes of four successive integration times.

SUMMARY OF THE INVENTION

It is an object of the invention to provide a CCD image sensor device in which the stored charge is transferred more efficiently to the memory part and which can be designed for different forms of multiphase transport.

More generally, it is an object of the invention to provide a charge coupled semiconductor device, especially a charge coupled image sensor device, with increased information density.

The invention is based on the recognition that increased information density and more efficient charge transfer can be achieved by selectively driving the electrodes producing the potential wells in the semiconductor body.

For this purpose, a device according to the invention is provided with switching elements. The switching elements are used to supply either the reference signal or the clock signal to selected electrodes.

By providing such a switching arrangement, the information density can be doubled. This means that both the radiation-sensitive part and the memory part can be considerably smaller. This can lead to an increased yield. Alternately, parts of the electronic control system, such as clock pulse generators and amplifiers, can now be provided together with the image sensor device in one semiconductor body. Further, with the same surface area, a larger number of image lines can be obtained. With more lines, the sensor device is suitable for higher resolution cameras (high definition television).

A device according to the invention is operated by a method which is described in U.S. Pat. No. 4,178,614. In the method described in this patent, electrodes of an electrode system forming part of a charge-coupled device are controlled directly from registers. If such an electrode system is, as is common practice, a multilayer system, due to differences in threshold voltage under electrodes of different phases, the depths of the potential wells can vary with the same operating voltages.

As a result, with the so-called interlacing, the integration behavior for even numbered lines can differ from that for odd numbered lines. Due to the fact that in a device according to the invention the electrodes of even and odd numbered lines can be maintained during the integration period at different reference voltages, such a difference in integration behavior can be eliminated.

BRIEF DESCRIPTION OF THE DRAWING

The Figures are schematic and not drawn to scale. For the sake of clarity, the dimensions are greatly exaggerated. Semiconductor zones of the same conductivity type are generally cross-hatched in the same direction. Corresponding parts are generally designated by the same reference numerals.

DESCRIPTION OF THE PREFERRED EMBODIMENTS

Figure 1:
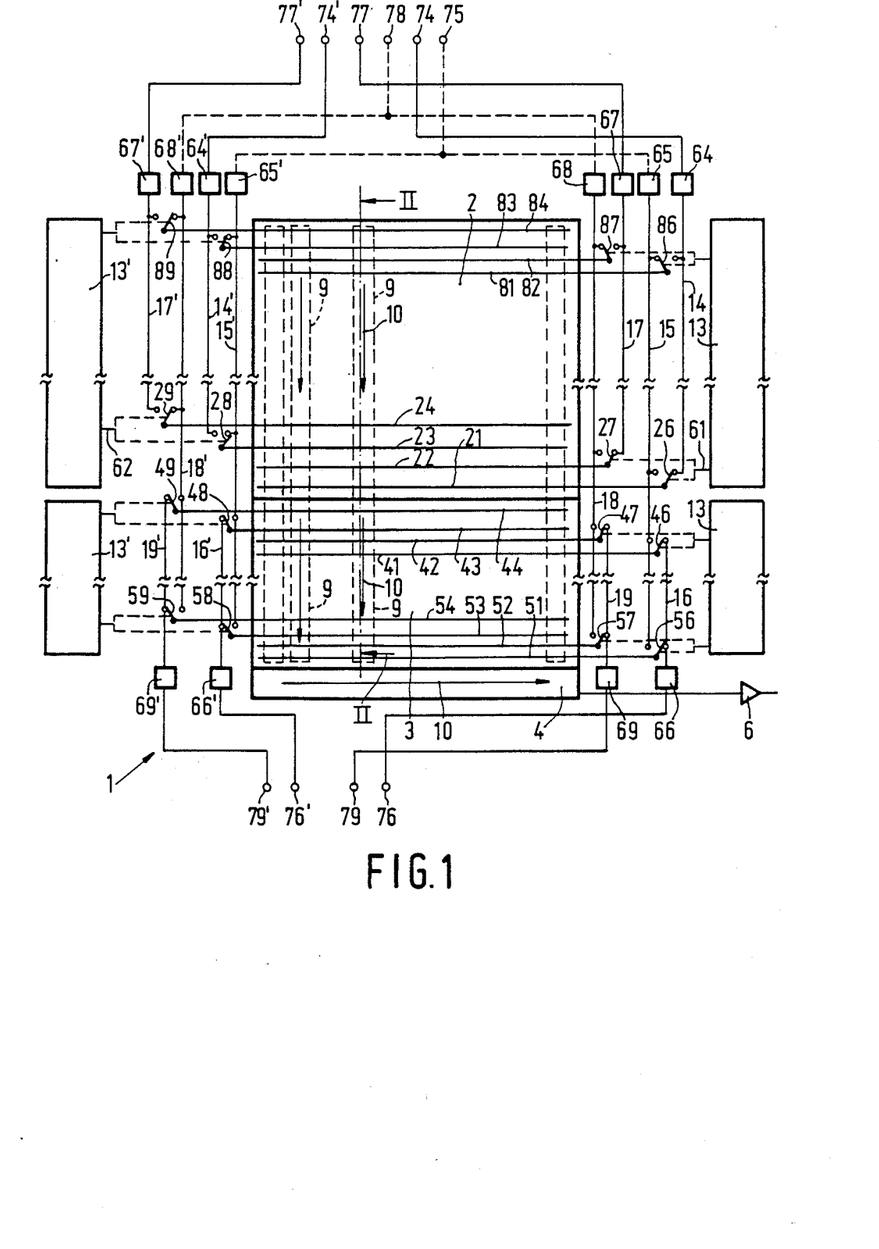
FIG. 1 schematically shows an image sensor device according to the invention which is controlled by a four phase clock.

FIG. 1 shows an image sensing device 1 of the so-called frame-field transfer type. Such an image sensing device comprises a radiation-sensitive sensor part 2 and a memory part 3. During each exposure period, a pattern of electric charge carriers corresponding to the radiation image is formed in the sensor part 2. After the exposure period, the pattern of electric charge carriers is temporarily stored in the memory part 3. The pattern is sequentially read out of memory part 3 by one or more shift registers 4. The charge can be read out by known techniques. If desired, the signals may be amplified before being further processed by the amplifier 6 shown diagrammatically.

Figure 2A:
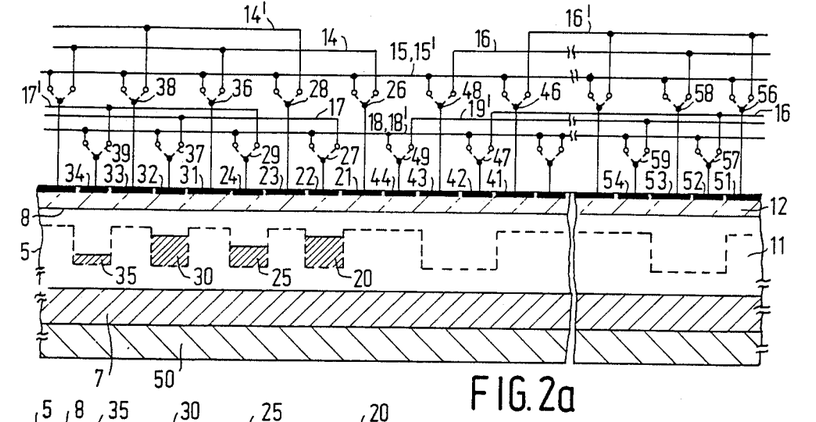
FIG. 2a is a schematic cross-sectional view of the image sensor device taken on part of the line II—II in FIG. 1.

The image sensor device (FIGS. 1-2) comprises a semiconductor body 5. Body 5 is composed, for example, of an n-type silicon substrate 50 having a resistivity of approximately 10$\Omega$.cm (approximately $5.10^{14}$ donor atoms./cm$^3$). A p-type region 7 is formed in body 5 and has a dopant concentration of approximately $3.10^{15}$ acceptor atoms/cm$^3$. The p-type region 7 may be formed, for example, by ion implantation followed by diffusion.

At the major surface 8 of the semiconductor body 5, a number of substantially parallel charge transfer channels 9 are defined. Charges can be transported in channels 9 as indicated schematically in FIG. 1 by arrows 10.

In the present case, the charge transfer device or CCD is a CCD with bulk transport (a PCCD or BCCD). The charge transport channels are then n-type regions 11, which are separated from each other by p-type regions. The n-type region 11 in this embodiment each have an average impurity concentration of approximately $10^{16}$ atoms/cm$^3$, a depth of about $1/\mu$m, and a width of approximately $5/\mu$m.

The major surface 8 (FIG. 2) is covered with a layer 12 of insulating material, for example silicon oxide. On and in this insulating layer 12 are provided a number of electrodes. By applying suitable potentials to the electrodes, potential wells can be produced in the semiconductor material for storing and transporting charge.

In the device of FIG. 2a, which is suitable for four phase transport, each so-called "storage element" in a channel 9 of the sensor part 2 comprises four electrodes 21, 22, 23, and 24 and 31, 32, 33, and 34, respectively. The electrodes are common to "storage elements" in several channels. Similarly, in the memory part 3 such "storage elements" are formed by electrodes 41, 42, 43, and 44 and 51, 52, 53 and 54, respectively.

In practice, the device comprises a considerably larger number of electrodes than are shown here. In an image sensor device for the so-called PAL system, both the sensor part 2 and the memory part 3 comprise approximately 600 electrodes. These electrodes correspond to 150 "storage elements" per charge transport channel.

In the present embodiment comprising 600 electrodes, both in the sensor part 2 and in the memory part 3, each of the electrodes can be switchably supplied with a clock pulse (transport clock voltage) or a storage signal (reference level or storage clock voltage). The device is provided with switching elements 26, 27, 28, 29, 36, 37, 38, 39, 46, 47, 48, 49, 56, 57, 58, and 59 for this purpose. By using these switching elements, the electrodes can be switched between signal lines 14 and 16 and reference lines 15, and between signal lines 17 and 19 and reference lines 18, respectively. The reference lines 15 and 18 need not necessarily have a fixed potential. As will be explained more fully hereinafter, the reference potential is preferably adjustable.

The switching elements are controlled by registers 13 and 13'. When the electrodes at one wiring level are controlled alternately by registers 13' on the left side and registers 13 on the right side, the pitch of the registers (i.e. the distance between two successive outputs) can be approximately twice the pitch of the electrodes of one wiring level. This arrangement considerably simplifies the device.

It should be noted that each output of the registers 13 and 13' simultaneously controls two switching elements, and thus determines the behavior of two electrodes. This in contrast with the four phase transport device shown in U.S. Pat. No. 4,178,614, in which each register stage controls one electrode. Therefore, the registers 13 and 13' can be half as large as the registers shown in the patent. A further size reduction is possible due to the fact that in the device of FIG. 1 the outputs of the registers are loaded with only two switching elements (in this case gate electrodes). In the device according to U.S. Pat. No. 4,178,614, each register is directly loaded with an electrode of the charge coupled device. The CCD electrodes can, especially in an image sensor device, constitute a considerable capacitive load.

For a better understanding, in FIG. 1 the lines 15' and 18' may be driven, if desired by the same signals as the lines 15 and 18, respectively. The lines may be connected to each other externally by connection points 65 and 68, and 65' and 68', respectively. In the present embodiment, such connections are in turn connected to connection points 75 and 78 for obtaining the reference signals.

In the device shown in FIG. 1, the clock pulse signals are supplied separately to the sensor part 2 and to the memory part 3. For the sensor part 2, the clock signal lines 14, 14', 17 and 17' are connected via connection points 64, 64', 67, 67' to external connections 74, 74', 77 and 77' for a four phase clock system. For the memory part 3, clock signal lines 16, 16', 19 and 19' are connected via connection points 66, 66', 69 and 69' to external connections 76, 76', 79 and 79', also for a four phase clock system. If desired, the same connection points may be used. Alternatively, the clock lines 14, 14', 17 and 17' may be connected to the clock lines 16, 16', 19 and 19', respectively. In the latter case, the connection points 66, 66', 69 and 69' as well as the connections 76, 76', 79 and 79' may be dispensed with.

The registers 13 and 13' which control the switching elements 26, 27, 28, 29, 86, 87, 88, 89, 46, 47, 48, 49, 56, 57, 58, and 59, are controlled, for example, by an auxiliary electronic system (not shown). For synchronization purposes, the auxiliary system may also be controlled by clock pulse signals at the connections 74, 76, 74' and 76', respectively, or 77, 79, 77' and 79' respectively.

Figure 3:
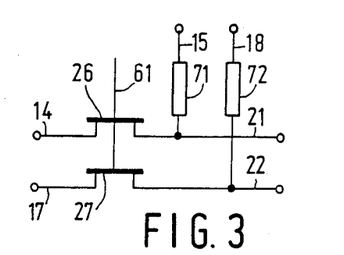
FIG. 3 schematically shows a switching element for the device shown in FIG. 1.

The switching elements 26 and 27 may be, for example, MOS transistors, as shown in FIG. 3. The n-MOS transistors are driven by the register 13 by a common gate electrode 61. When the signal or gate electrode is high, the transistors 26 and 27 are conducting. The clock pulse signals, which are supplied to the source zones from the connections 14 and 17, are passed on to the electrodes 21 and 22. In this manner, a four phase clock can be supplied by the switching elements 26, 27, 28, 29, 36, 37, 38, 39, . . . 86, 87, 88, 89 and 56, 57, 58, 59, . . . . 46, 47, 48, 49 via the common clock lines 14, 14′, 17, 17′ and 16, 16′, 19, 19′, respectively, at the electrodes 21, 22, 23, 24, 21, 32, 33, 34, . . . 81, 82, 83, 84 and 51, 52, 53, 54 . . . 41, 42, 43, 44, respectively, of the sensor part 2 and the memory part 3, respectively.

When the signal at the gate electrodes 61 is low, the transistors 26 and 27 are cut off. The potential at the electrodes 21 and 22 is then determined by the potential at the outputs of these transistors. This potential may be a fixed voltage, it may be determined by adjustable signals at the lines 15 and 18.

For further processing, the stored charge (which corresponds to an incident image) is generally converted into a television compatible signal. It is then usual to alternately read the even and odd numbered lines of the image screen. For this so-called interlacing, it is therefore desirable that within one image period (1/30–1/25 sec) charge is transferred twice from the radiation-sensitive part to the storage part. The charge corresponding to the image is collected alternately in different parts of the radiation-sensitive part. For this purpose, in the image sensor device the charge packets are alternately collected at different areas within each image period (i.e. alternately under the electrodes 21, 23, 31, 33 etc. and the electrodes 22, 24, 32, 34, etc.), depending upon the voltages at the lines 15, 15′, 18 and 18′.

The storage voltages (reference levels), which are used during the one integration period for integration under the electrodes 21, 23, 31, 33, . . . , need not be equal to those which are used during the next period for integration under the electrodes 22, 24, 32, 34, . . . Due to the fact that these groups of electrodes are generally provided in different wiring layers, different threshold voltages and hence different depths of the potential wells may occur. The integration behavior is then not equal for both groups of electrodes. Depending upon the extent of inequality, the connection points 65, 65′, 68, 68′ can be furnished with different storage voltages. If the inequality in integration behavior is practically negligible, the connection point 65, 65′ and 68, 68′ can be commonly connected to external connections 75 and 77 respectively.

The operation of the image sensing device shown in FIG. 1 will now be described with reference to FIGS. 2a–2k.

FIG. 2a shows the charge collection in one channel at the end of an integration period during the first half of an image period at an instant t=0.

Charges have been integrated under the electrodes 22, 24, 32, 34, . . . 82, 84 by connecting these electrodes via the switching elements 27, 29, 37, 39, . . . 87, 89 to the reference lines 18 and 18′ having a high voltage. The electrodes 21, 23, 31, 33, . . . 81, 83 were connected via the switching elements 26, 28, 36, 38 . . . 86, 88 to the reference lines 15 and 15′ having a low voltage.

The surface potential obtained in the semiconductor body due to the voltages at the transport electrodes is indicated by broken lines in FIGS. 2a to 2g. The potential variation is shown in a usual manner so that potential wells correspond to energy minima. For electrons, energy minima are obtained in parts of the semiconductor body which are situated under high voltage electrodes.

The broken line in FIG. 2a corresponds (at least for the sensor part) to the potential variation obtained during the integration period by the fixed voltages at the electrodes 21, 22, 23, 24, 31, 32, 33, 34, . . . 81, 82, 83, 84. During the integration period, the charge packets 20, 25, 30 and 35 are collected under the electrodes 22, 24, 32 and 34, respectively. The electrodes 41, 42, 43, 44, and 51, 52, 53, and 54 are connected via the switching elements 46, 47, 48 and 49, and 56, 57, 58 and 59 to the signal lines 16, 19, 16′ and 19′. A four phase clock can be supplied to these signal lines. The broken line in the memory part of the device shown in FIG. 2a represents the associated potential variation. Such a clock pulse pattern is then supplied that at an instant t=0 potential wells are situated under the electrodes 42 and 43, and 52 and 53, respectively, and corresponding electrodes in the memory part. Under the electrodes 41 and 44, and 51 and 54, and corresponding electrodes, potential barriers are situated. The potential wells in the memory part are assumed to contain no charge or at most a small quantity of charge due to noise at t=0.

It will be apparent from FIG. 2a that two charge packets are collected under each "storage element" (each storage element being defined by four electrodes) in the sensor part 2. Therefore, in a channel with 600 electrodes, 300 charge packets can be stored. This means that in the preceding integration period 300 image lines are recorded in the image sensor part. With respect to the device described in U.S. Pat. No. 3,909,803, twice the number of image lines are recorded with the same number of electrodes. The use of switching elements according to the invention also provides the possibility of shifting stored charge in two directions, which may have certain advantages in signal processing.

Figure 2B:
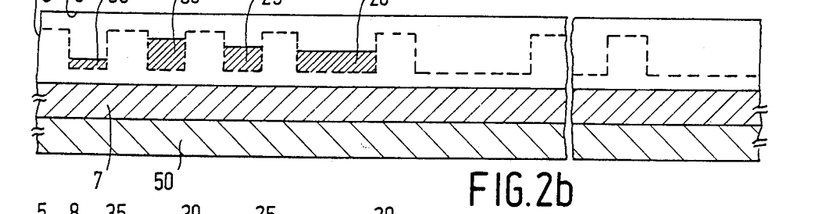
FIGS. 2b to 2k schematically illustrate the operation of the device shown in FIG. 1.
Figure 2C:
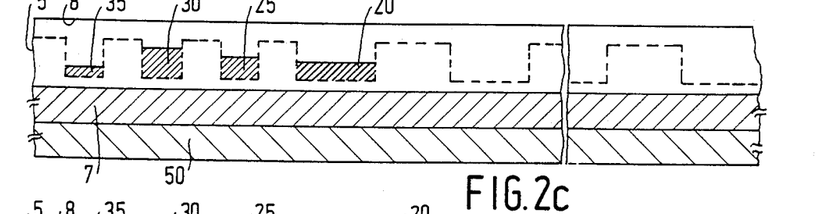
Figure 2D:
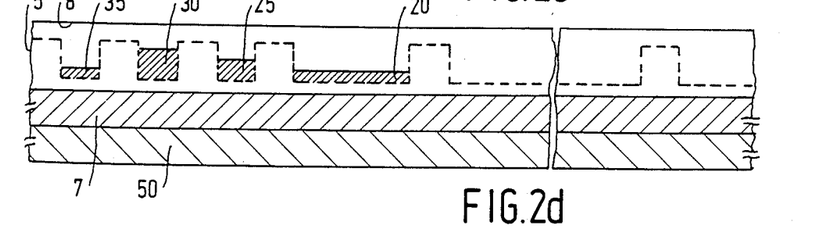

FIG. 2b shows the device at the instant $t_1 = 0.125/u$sec. Register 13 activates the switching elements 26 and 27 via the control line 61 such that the electrodes 21 and 22 are connected to the clock lines 14 and 17, respectively. In this embodiment, clock lines 14 and 17 are driven in the same manner as the clock lines 16 and 19. As a result, on the left side of the electrode 22 (FIG. 2b) the potential in the semiconductor body remains unchanged.

On the right side of the electrode 23, the potential is determined by the clock pulse pattern at the signal lines 14, 17, 16, 19, 16′ and 19′. This means that the voltage at the electrode 21 becomes high so that the width of the potential well for the charge packet 20 is effectively doubled. The associated charge is distributed over the potential well under the electrodes 21 and 22. Potential barriers are now present under the electrodes 44, 54 and corresponding electrodes.

At the lines 14, 17, 16, 19, 16′ and 19′ clock pulses are supplies such that at $t_2 = 0.25/u$sec the voltages at the electrodes 43, 53 and corresponding electrodes become low. The remaining electrodes retain the same voltages so that now potential barriers are present under the electrodes 43, 44, 53, 54, and corresponding electrodes (see FIG. 2c). The potential well under the electrodes 21 and 22 is maintained so that the charge packet 20 remains in the same place.

At $t_3 = 0.375/u$sec, only the electrodes 43, 53 and corresponding electrodes in the memory part 3 have a low voltage. Therefore, potential barriers are present only under these electrodes. (See FIG. 2d.) As a result, the charge packet 20 is distributed over a potential well located under the electrodes 22, 21 and 44.

Figure 2E:
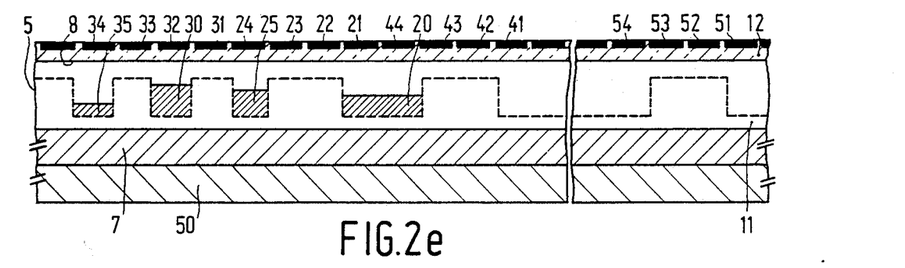

At $t_4=0.5$/usec the switching elements 28 and 29 are activated by the control register 13' via the control line 62. As a result, the electrodes 23 and 24 are connected to the clock lines 14' and 17'. Clock lines 14' and 17' are driven in the same manner as the clock lines 16' and 19'. Consequently, the potential in the semiconductor body to the left of electrode 24 now remains unchanged. The potential to the right of the electrode 31 is determined by the clock pulse pattern at the signal lines 14, 17, 16, 19, 14', 17', 16' and 19'. Due to the clock pulse pattern, potential barriers are now formed in the semiconductor body under the electrodes 22, 23, 42, 43, 52, 53 and corresponding electrodes (FIG. 2e). This means that the charge packet 25 remains solely under the electrode 24. The charge packet 20 is now present under the electrodes 21 and 44. Thus, charge packet 20 has been shifted through one electrode distance with respect to its position at $t_2$.

At $t_5=0.625$/usec (see FIG. 2f) potential barriers are present under the electrodes 22, 42, 52 and similar electrodes in the memory part. The charge packets 20 and 25 are now distributed under three electrodes (21, 44, 43) and two electrodes (24, 23), respectively. In this manner, the charge packet 20 is removed from the sensor part 2 and is transferred to the memory part 3. Also, now the charge packet 25 will be transferred to the memory part 3 under the influence of the clock pulse pattern.

The switching pattern described above is continued until $t=149.5$/usec, when the switching elements 88 and 89 (FIG. 1) are switched so that the electrodes 83 and 84 are connected to the signal lines 14' and 17'. At that instant, all electrodes both in the sensor part and in the memory part are controlled by the clock pulse pattern at the lines 14, 17, 16, 19, 14', 17', 16', 19'. In each of the transport channels 9, the charge packets, which were initially present under the electrodes 22, 24, 32, 34, . . . 82, 84, are now effectively extended to a row of charge packets which extends substantially throughout the channel in both the sensor part and the memory part.

Figures 2F, 2G, 2H, 2I, 2J, 2K:
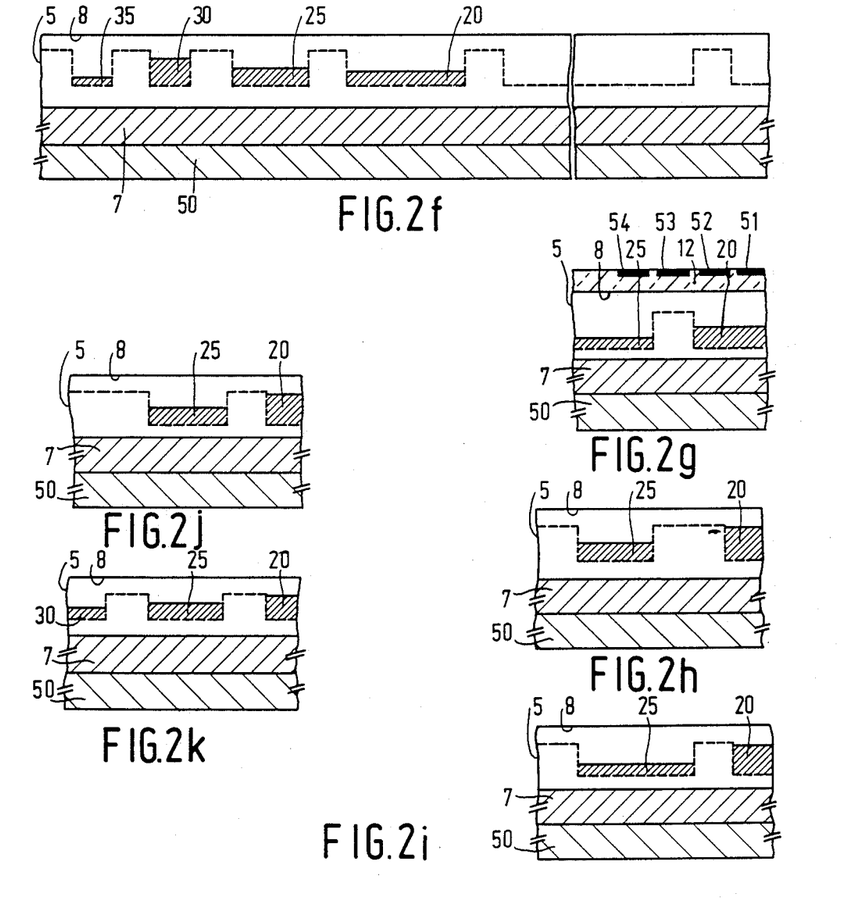

The charge packets are then transported to the end of the memory part 3. Thus, the charge packet 20 is located, at $t=150.375$/usec, under the electrodes 51 and 52. Charge packet 20 is separated from the charge packet 25 by a potential barrier under the electrode 53 (FIG. 2g).

In order to store the charge packets 20, 25, 30, 35 . . . in the memory part, the transport electrodes in the memory part are successively switched to a fixed voltage. Thus, at $t=1.50.5$/usec the switching elements 56 and 57 are switched to the lines 15 and 18, which have fixed voltages. As a result a potential barrier is now located under the electrode 52 so that the charge packet 20 is fixed in the potential well under the electrode 51 (FIG. 2h). The clock pulses no longer affect electrodes 51 and 52, as shown in FIGS. 2i, 2j and 2k (which represent the potentials under the electrodes 51, 52, 53 and 54 at $t=150.625$/usec, $t=150.75$/usec and $t=150.875$/usec, respectively).

At $t=151$/usec, the electrodes 53 and 54 are connected via the switching elements 58 and 59 to the fixed voltages. As a result, the charge packed 25 is stored under the electrode 53. This procedure is continued until at $t=300$/usec the original charge pattern from the sensor part 2 is stored entirely in the memory part 3 (i.e. under the electrodes 51, 53, . . . 41, 43). This is due to the fact that these electrodes and the electrodes 52, 54, . . . 42, 44 are connected via the switching elements 56, 57, 58, 59, . . . 46, 47, 48, 49 to the lines 15, 15', 18 and 18', which each have a fixed voltage. This can be achieved via separate connection points 65, 68, 65' and 68' or via common connection points 75 and 78.

The electrode in the sensor part 2 can be controlled, until all charges are stored in the memory part 3, by the clock pulse signals described above. Then the sensor electrodes can be connected to the reference lines 15, 18, 15', 18'. As in the memory part 3, the potential wells will then be located in the image sensor part 2 under the electrodes 21, 23, . . . 81, 83.

Alternatively, from the instant at which the charge packet originally generated under the electrode 84 has been shifted under the electrode 82, the electrodes 83 and 84 may be connected via the switching elements 88 and 89 to the reference lines 15' and 18'. When the generated charge is further shifted to the memory part, an increasing number of electrodes are sequentially connected in the same manner to the reference lines 15, 18, 15' and 18', and potential wells are formed under the electrodes 83, 81, . . . 23, 21.

As a result, in the next integration period charge is integrated under the odd numbered electrodes instead of under the even numbered electrodes 84, 82 . . . 24, 22. In this manner, interlacing is possible.

During the integration period, charge information is transferred from the memory part 3 to one or more output registers 4. The charge can be transferred by successively connecting the electrodes 51, 52, 53, 54, . . . 41, 42, 43, 44 of the memory part 3 to the clock pulse signal lines 16, 19, 16', 19'. For color display purposes, three parallelly connected output registers are utilized (i.e. each for one of the color components). The signals from the output registers 14 are amplified, if required, by the amplifier 6.

The device of FIGS. 4 and 5a–5f comprises an image sensor device 1 suitable for two phase transport. This device also has 600 electrodes in the sensor part 2 (of which FIG. 4 only shows the electrodes 21, 22, 23, 24, 81, 82, 83, 84), and 600 electrodes in the memory part 3 (of which only the electrodes 41, 42, 43, 44, 51, 52, 53, 54 are shown).

Figure 4:
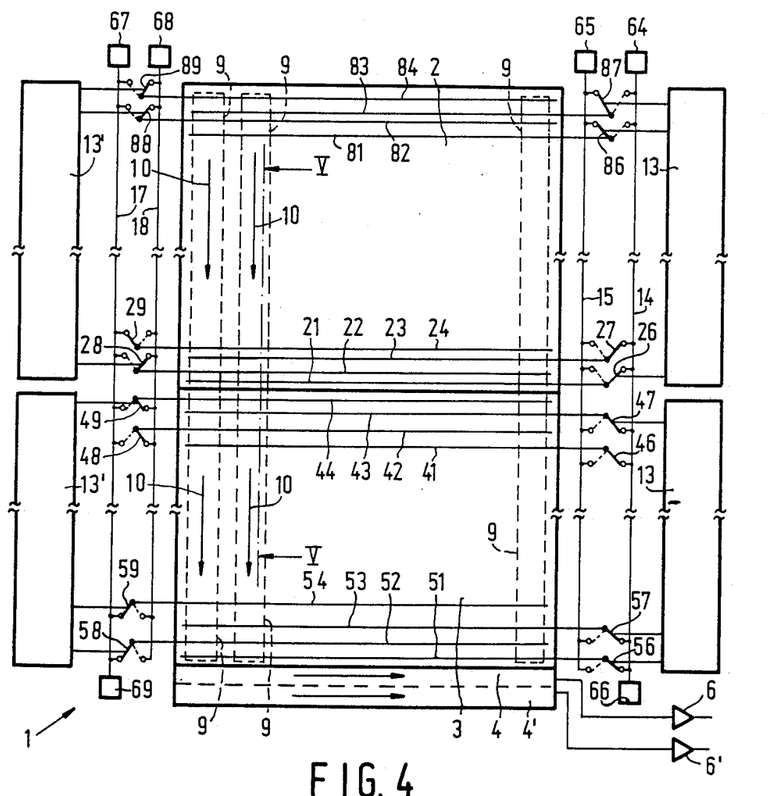
FIG. 4 schematically shows an image sensor device controlled by a two phase clock.

The electrodes 21, 23, 81 and 83 and corresponding electrodes in the sensor part 2 may be switched by switching elements 26, 27, 86, 87, etc. between a reference line 15 and a line 14 to which a clock pulse may be supplied. In the same manner, the electrodes 41, 43, 51, 53 and corresponding electrodes of the memory part 3 are switched between the reference line 15 and the line 14 by switching elements 46, 47, 56, 57.

In an analogous manner, electrodes 22, 24, 82, 84, 42, 44, 52, 54 are switched by switching elements 28, 29, 88, 89, 48, 49, 58, 59 between the clock pulse line 17 and the reference line 18. The switching elements 26, 27, 28, 29, . . . 86, 87, 88, 89 are controlled again by registers 13 and 13'. Voltages may be supplied to reference line 15 and 18 at the junctions 65 and 68, respectively. The clock pulse patterns are supplied at the junctions 64 and 67. In the present embodiment, the clock pulse lines for the sensor part 2 and for the memory part 3 are interconnected. If desired, the clock pulse voltages for the memory part 3 may be supplied separately at the junctions 66 and 69. These clock pulses may also control, if desired, the auxiliary electronic system for controlling the registers 13 and 13'.

In the embodiment shown in FIG. 4, both the image sensor part 2 and the memory part 3 comprise 600 electrodes. As described below, charge can be integrated or stored simultaneously under each of these electrodes. As a result, double the number of image lines are integrated in each image sensor period as compared with the device shown in FIGS. 1 and 2.

The operation of the image sensor device shown in FIG. 4 will now be described more fully with reference to FIGS. 5a–5f.

Figure 5A:
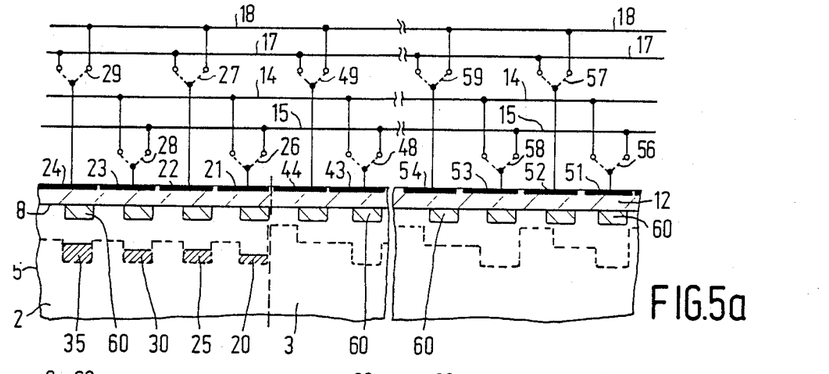
FIG. 5a is a schematic cross-sectional view of the image sensor device taken on part of the line V—V in FIG. 4.

FIG. 5a shows the potential in a part of a charge transfer channel at the end of an integration period at t=0. Charge has been integrated under all electrodes 21, 22, 23, 24, ... 81, 82, 83, 84 of the sensor part 2. Due to the fact that an n-type implantation 60 has been provided under each electrode, a potential well is present under each of these electrodes if they are connected via switching elements 26, 27, 28, 29, ... 86, 87, 88, 89 to a fixed voltage at the signal lines 15 or 18. The associated potential in the semiconductor body is again indicated by broken lines in FIG. 5a. After the integration period, the charge packets 20, 25, 30 and 35 have been collected in the potential wells associated with the electrodes 21, 22, 23 and 24.

The electrodes 41, 42, 43, 44, ... 51, 52, 53, 54 are connected via switching elements 46, 47, 48, 49, ... 56, 57, 58, 59 to the signal lines 14 and 17. A two phase clock is supplied to signal lines 14 and 17. As a result, the potential in the right half of FIG. 5a has an appearance quite different from that in the left half. The associated potential wells in the right half are assumed to contain no charge at t =0.

Figure 5B:
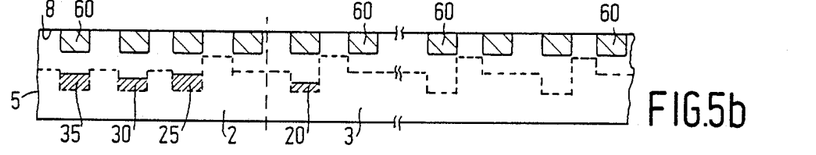
FIGS. 5b to 5f schematically illustrate the operation of the device shown in FIG. 4.

FIG. 5b shows the device at $t_1=0.25$/usec, after the switching element 26 has been switched via the register 13 in such a manner that the electrode 21 is now connected to the clock line 14. Due to the associated potential variation, the charge packet 20 is displaced to a potential well under the electrode 44.

Figure 5C:
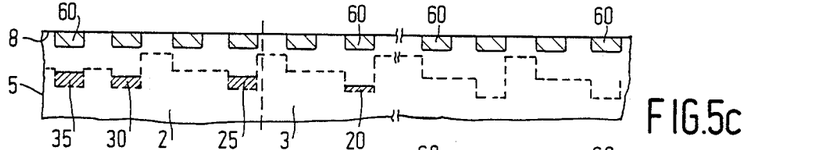

At $t_2=0.5$/usec, the electrode 22 is connected to the clock line 17. The potential variation consequently obtained in the subjacent semiconductor body is now identical to the potential of the right half of the semiconductor body at t=0 (FIG. 5c). The charge packets 20 and 25 are displaced to potential wells under the electrodes 43 and 21, respectively.

Figure 5D:
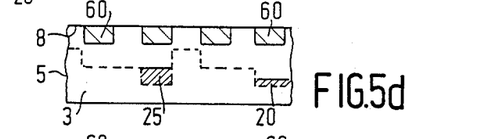

In the same manner as described with reference to the four phase device of FIGS. 1 and 2, the electrodes 23, 24, ... 81, 82, 83, 84 are then connected one by one to the clock lines 14 and 17. As a result, the charge packets are transported to the memory part. At t=150/usec, the charge packet 20 has arrived under the electrode 51 (FIG. 5d). The charge packet 25 is present under the electrode 53. At that instant, all electrodes are connected to the clock lines 14 and 17.

Figure 5E:
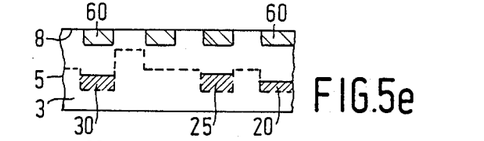
Figure 5F:
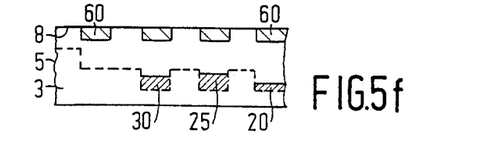

At t=150.5/usec, the electrode 51 is connected via the switching element 56 to a fixed voltage at the reference line 15 (FIG. 5e). From that instant, the charge packet 20 is held under the electrode 51. In the same manner, from t=151/usec, the charge packet 25 is held under the electrode 52 (FIG. 5f). The remaining electrodes of the memory part are now successively connected to the reference lines 15 and 18 until at t=300/usec potential wells are present under all electrodes in the memory part 3. The charge pattern stored in memory part 3 is now identical to that which was in the sensor part 2 at t=0.

The information stored in the memory part 3 can be transferred again gradually to the read out register 4. Register 4 is now preferably a double register in which the 600 lines are read out alternately via a register for odd lines and a register for even lines. The signals supplied by the registers 4 are amplified again, if required, by amplifiers 6.

If desired, the device may also be used for recording one scene at a time. In this case, after one integration the information is read out and is recorded on an information carrier, such as magnetic tape. In this case, the information need not be stored in a memory part, but can be transferred directly from the sensor part 2 via a readout register to, for example, an information processing unit.

The invention may also be used in a device for multiple interlacing. In such a device with 1:n interlacing, the image sensor part comprises a number of electrodes n/2 times that of the memory part. Therefore, the memory part need comprise only 2/n times the number of electrodes of the image sensor part.

In addition, the principle of the invention can also be utilized in a series/parallel/series memory (SPS-memory). Such a memory comprises several adjacent charge transfer channels. Information is first serially read into an input register. The contents of the input register is then transferred in parallel to the charge transfer channels. In the channels, the information is displaced in parallel. Then the information can again be read out serially via a readout register.

When charge is transferred and stored in the parallel part as described above, the information density therein can be doubled. Thus, in a device which uses a two phase clock, an information bit can be stored in each channel under each electrode.

The principle of the invention can also be applied in other charge coupled devices in which charge should be temporarily stored. For example, the invention can be applied to a delay line where the information is read out after a delay. The invention can be used in several devices arranged in a multiplex circuit arrangement, in which the information can be read out arbitrarily from one of the charge coupled devices.

What is claimed is:

1. A charge coupled device comprising:
   a semiconductor body having a surface-adjoining semiconductor region in which a charge transfer channel for storing and transporting discrete charge packets is defined;
   a system of electrodes arranged above the charge transfer channel;
   means for supplying transport clock voltages to the electrodes for transporting the charge packets through the charge transfer channel, said means supplying voltages such that in regions where charge is being transported there is one charge packet for each m successive electrodes, where m is an integer greater than or equal to two;
   means for supplying storage clock voltages to the electrodes for generating in the charge transfer channel a system of potential wells separated by potential barriers, each potential well being associated with n successive electrodes for storing one charge packet, where n is less than m; and
   means for switchably connecting the electrodes to the storage clock voltage supply means or to the transport clock voltage supply means, said switchable means connecting the electrodes to the storage clock voltage supply means during storage of charge packets in the charge transfer channel, said switchable means then sequentially reading out the charge packets by sequentially switching the electrodes to the transport clock voltage supply means.

2. A device as claimed in claim 1, characterized in that the switchable means comprises an MOS transistor connector to each electrode.

3. A device as claimed in claim 2, characterized in that the switchable means further comprises at least one register for controlling the MOS transistors.

4. A device as claimed in claim 1, characterized in that the storage clock voltages can be varied.

5. A device as claimed in claim I, characterized in that:
the charge transfer channel has first and second ends; and
the switchable means sequentially switches the electrodes to the transport clock voltage supply means from the first to the second end.

6. A charge coupled device comprising:
a semiconductor body having a surface-adjoining semiconductor region in which a charge transfer channel for storing and transporting discrete charge packets is defined;
a system of electrodes arranged above the charge transfer channel;
means for supplying transport clock voltages to the electrodes for transporting the charge packets through the charge transfer channel, said means supplying voltages such that in regions where charge is being transported there is one charge packet for each m successive electrodes, where m is an integer greater than or equal to two;
means for supplying storage clock voltages to the electrodes for generating in the charge transfer channel a system of potential wells separated by potential barriers, each potential well being associated with n successive electrodes for storing one charge packet, where n is less than m; and
means for switchably connecting the electrodes to the storage clock voltage supply means or to the transport clock voltage supply means, said switchable means connecting the electrodes to the transport clock voltage supply means during reading of charge packets into the charge transfer channel, said switchable means then sequentially storing the charge packets in the charge transfer channel by sequentially switching the electrodes to the storage clock voltage supply means.

7. A device as claimed in claim 6, characterized in that the switchable means comprises an MOS transistor connected to each electrode.

8. A device as claimed in claim 7, characterized in that the switchable means further comprises at least one register for controlling the MOS transistors.

9. A device as claimed in claim 6, characterized in that the storage clock voltages can be varied.

10. A device as claimed in claim 6, characterized in that:
the charge transfer channel has first and second ends;
charges are read into the charge transfer channel from the first end; and
the switchable means switchably stores charge packets by sequentially switching electrodes to the storage clock voltage supply means from the second end to the first end.

* * * * *